United States Patent
Kawasaki et al.

(10) Patent No.: US 6,563,174 B2
(45) Date of Patent: May 13, 2003

(54) THIN FILM TRANSISTOR AND MATRIX DISPLAY DEVICE

(75) Inventors: Masashi Kawasaki, 35-1-101, Kawauchimotohasekura Aoba-ku, Sendai-shi Miyagi (JP), 980-0861; Hideo Ohno, 3-33-10, Katsura Izumi-ku, Sendai-shi Miyagi (JP), 981-3134; Kazuki Kobayashi, Izumi (JP); Ikuo Sakono, Soraku-gun (JP)

(73) Assignees: Sharp Kabushiki Kaisha, Osaka (JP); Masashi Kawasaki, Miyagi (JP); Hideo Ohno, Miyagi (JP)

( * ) Notice: Subject to any disclaimer, the term of this patent is extended or adjusted under 35 U.S.C. 154(b) by 0 days.

(21) Appl. No.: 10/224,879

(22) Filed: Aug. 21, 2002

(65) Prior Publication Data

US 2003/0047785 A1 Mar. 13, 2003

(30) Foreign Application Priority Data

Sep. 10, 2001 (JP) ........................ 2001-274333

(51) Int. Cl.$^7$ ................. H01L 27/01; H01L 27/12; H01L 31/0392
(52) U.S. Cl. ................. 257/350; 257/59; 257/72
(58) Field of Search ............... 257/59, 72, 350

(56) References Cited

U.S. PATENT DOCUMENTS

| 5,744,864 A | 4/1998 | Cillessen et al. | |
|---|---|---|---|
| 6,281,552 B1 * | 8/2001 | Kawasaki et al. | 257/350 |
| 6,291,837 B1 * | 9/2001 | Nakajima et al. | 257/57 |

FOREIGN PATENT DOCUMENTS

| EP | 1 172 858 | 1/2002 |
|---|---|---|
| JP | 05-251705 | 9/1993 |
| JP | 06-067187 | 3/1994 |
| JP | 09-059087 | 3/1997 |

* cited by examiner

Primary Examiner—Ngan V. Ngo
(74) Attorney, Agent, or Firm—David G. Conlin; John B. Alexander; Edwards & Angell, LLP (57) ABSTRACT

In a thin film transistor, a gate insulating film having a first insulating film and a second insulating film is formed on a gate electrode, and a semiconductor layer including ZnO etc. is formed on the second insulating film. The first insulating film is formed by using $SiN_x$ having a high insulating characteristic, and the second insulating film is formed by using an oxide (for example, $SiO_2$). This structure improves a crystalline characteristic of the semiconductor layer that constitutes an interface in combination with the second insulating film, and decreases a defective level of the interface between the semiconductor layer and the second insulating film. Further, the second insulating film is constituted of the oxide, so that it is possible to restrain a material for the second insulating film from depriving oxygen of the semiconductor layer. This keeps a crystalline characteristic of the semiconductor layer under a preferable condition in the vicinity of the interface between the second insulating film and the semiconductor layer. As a result, it is possible to realize a thin film transistor such that: a leak current level at an OFF area is low, and the mobility is high, and a switching characteristic is preferable. Thus, in the thin film transistor having a transparent semiconductor film, a TFT characteristic is improved.

24 Claims, 8 Drawing Sheets

ZnO/SiO2/SiNx STRUCTURE
L/W=5/20 μm
$\mu_{FE}$=1.30cm$^2$/Vs
Vds=15V

FIG. 4

ZnO/CaZrO3/SiNx STRUCTURE
L/W=5/20 μm
$\mu_{FE}$=1.8cm$^2$/Vs
Vds=15V

THIN FILM TRANSISTOR AND MATRIX DISPLAY DEVICE

FIELD OF THE INVENTION

The present invention relates to a thin film transistor having a transparent semiconductor film and to a matrix display device using the same.

BACKGROUND OF THE INVENTION

A matrix display device such as a liquid crystal display device includes: picture elements disposed in a matrix manner; and switching elements each of which applies a driving voltage to each picture element. When the switching element is turned ON, the driving voltage is applied to the picture element. When the switching element is turned OFF, the driving voltage is not applied to the picture element. A thin film transistor (TFT) which is widely used as such switching element is typically such that amorphous silicon is used to constitute a semiconductor layer.

Since the amorphous silicon exhibits the conductivity in accordance with irradiation of light, it is necessary to provide a channel-light-shielding film so as to prevent the deterioration of the switching characteristic. The provision of the shielding film causes the following problems: the manufacturing steps of the thin film transistor is increased, and decrease in an aperture ratio of the picture element causes a manufacturing cost to increase, and a display performance is deteriorated. Thus, in order to solve the problems, a transistor constituted of a transparent semiconductor material having no photocurrent is proposed.

For example, the transparent semiconductor material is disclosed in (Document 1) Japanese Unexamined Patent Publication No. 251705/1993 (Tokukaihei 5-251705) (Publication date: Sep. 28, 1993), (Document 2) Japanese Unexamined Patent Publication No. 067187/1994 (Tokukaihei 6-067187)(Mar. 11, 1994), and (Document 3) U.S. Pat. No. 5,744,864 (Date of Patent: Apr. 28, 1998).

The Document 1 discloses a technique such that: by using a transparent semiconductor layer whose carrier concentration is not more than $10^{18}$ cm$^{-3}$ when an energy band gap is not less than 3 eV, the shielding film is not required, so that the aperture ratio is increased. Further, the Document 2 discloses a technique such that: in order to increase the aperture ratio and decrease the manufacturing steps, one transparent semiconductor film constitutes a source section, a channel section, and a drain section of a liquid crystal driving transistor, and a liquid crystal driving electrode. Further, the Document 3 discloses an example in which, in order to obtain a transparent switching element, a degenerate semiconductor material having a band gap of not less than 2.5 eV as a channel layer is used.

Figure 10:
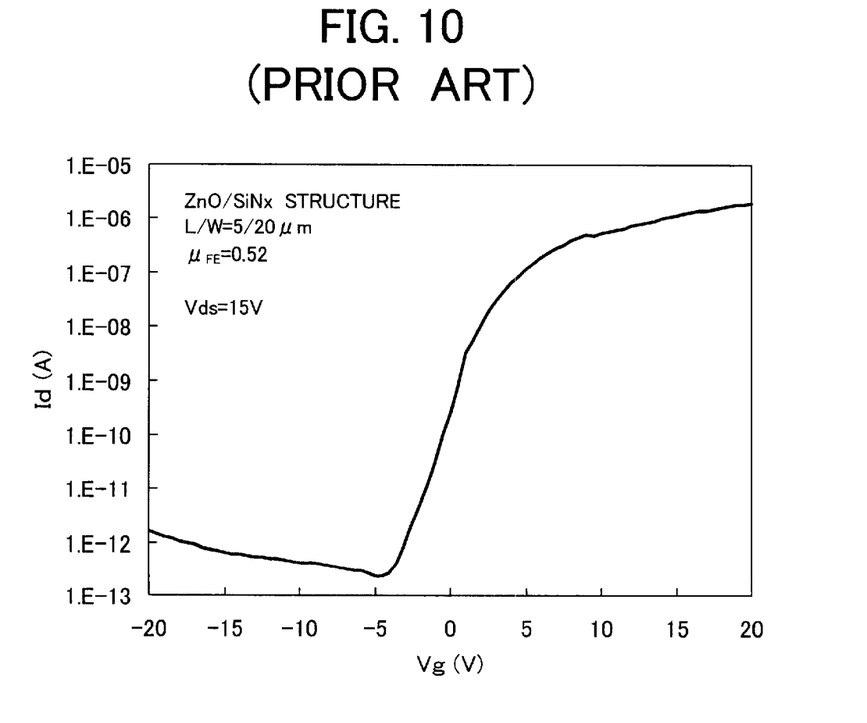
FIG. 10 is a graph showing a Vg-Id characteristic of an example of a conventional thin film transistor.

Here, FIG. 10 shows a Vg-Id characteristic of a conventional thin film transistor. The thin film transistor is such that: an SiNx (single layer), formed in accordance with a PECVD method typically used in manufacturing an a-Si (amorphous silicon) TFT, is used as a gate insulating film, and ZnO is used as a semiconductor material. FIG. 10 shows that: in a TFT whose size is suitable for a typical liquid crystal display having a channel size of approximately L/W=5/15 μm (L is a channel length, W is a channel width), it is possible to obtain the same effect as an a-SiTFT etc. whose field effect mobility (μFE) is 0.52 cm$^2$/Vs.

Further, a technique for obtaining a high-quality semiconductor material is disclosed in (Document 4) Japanese Unexamined Patent Publication No. 59087/1997 (Tokukaihei 9-59087)(Publication date: Mar. 4, 1997) and (Document 5) EP 1172858 A1 (Publication date: Jan. 16, 2002).

The Document 4 discloses a forming method of a thin film which includes the steps of: providing an intermediate layer, made of material different from a film forming material, on a surface of a glass substrate; and providing the film forming material on the intermediate layer, so as to improve the orientation of the film forming material. Further, the Document 5 discloses a forming method of a high-quality semiconductor thin film which is almost monocrystal. The semiconductor thin film is provided by using a material, in which the lattice misfit hardly occurs, as a base substrate.

In order to manufacture a higher-definition display or miniaturize a TFT so as to obtain a higher aperture ratio, it is necessary to further improve a TFT characteristic (mobility, ON/OFF ratio etc.).

In order to improve the TFT characteristic, it is necessary to improve a crystalline characteristic of a semiconductor material forming a channel, and to decrease the defective level in an interface between a semiconductor and a gate insulating film. Thus, it is important to properly select a material for an insulating film which constitutes the interface in combination with the semiconductor material.

However, according to the arrangements of the transistors etc. recited in the respective documents disclosing the transparent semiconductor material, it is not considered at all that: the insulating film exerts influence on the crystalline characteristic of the transparent semiconductor material, and various influence is exerted on a condition of the interface and the transistor characteristic of the TFT that has been manufactured. Further, the gate insulating films that constitute the channel and the interface respectively are made of a single insulating material. In a case where the insulating film using the SiNx (single layer) and the semiconductor layer constitute the interface in particular, SiNx deprives oxygen of ZnO, so that a crystalline characteristic of ZnO in the periphery of the interface is deteriorated.

While, in the forming method of the high-quality thin film, a substrate material for forming a thin film in a sedimentary manner, an intermediate layer and a buffering layer formed between the substrate material and the thin film are mentioned.

However, the technique is a technique for forming a thin film so as to be almost monocrystal, and it is not such that: the intermediate layer and the buffering layer are used as the gate insulating film when the thin film is used as the semiconductor layer of the field-effect-type transistor As described above, the prior art does not give any consideration with respect to the improvement of the TFT characteristic brought about by the selection of the gate insulating film in a case where the transparent semiconductor material is applied to the thin film transistor.

SUMMARY OF THE INVENTION

The object of the present invention is to provide (a) a thin film transistor having a gate insulating film which can improve the TFT characteristic, and (b) a matrix display device having the same, so as to apply the present invention to a switching element in a matrix display device, made of a transparent semiconductor material, more widely and more effectively.

In order to solve the foregoing problems, a thin film transistor of the present invention includes: a semiconductor layer made of ZnO, $Mg_x Zn_{1-x} O$, $Cd_x Zn_{1-x} O$ or CdO or ZnO, $Mg_x Zn_{1-x} O$, $Cd_x Zn_{1-x} O$ or CdO that have been doped with (a) an element that can be univalent or (b) Ni; and a gate insulating film, wherein the gate insulating film has: a first insulating film made of a material other than an oxide for constituting an interface in combination with a gate electrode; and a second insulating film, sandwiched between the first insulating film and the semiconductor layer, that has an oxide for constituting interfaces in combination with both the first insulating film and the semiconductor layer.

According to the arrangement, the oxide is used in the second insulating film, so that it is possible to keep the interface consistency under an extremely preferable condition. Further, a material other than the oxide is used in the first insulating film, so that it is possible to further improve an insulating characteristic of the thin film transistor manufactured in a relatively low temperature range, at which an a-SiTFT process is performed, compared with the second insulating film including the oxide.

In this manner, the gate insulating film is constituted of two insulating films different from each other, so that it is possible to improve a crystalline characteristic of the semiconductor layer that constitutes the interface in combination with the second insulating film, and it is possible to decrease the defective level of the interface between the semiconductor layer and the second insulating film. Further, the second insulating film is constituted of the oxide, so that it is possible to restrain a material for the second insulating film from depriving oxygen of the semiconductor layer (ZnO etc.). Therefore, a crystalline characteristic of the semiconductor layer is kept under a preferable condition in the vicinity of the interface between the second insulating film and the semiconductor layer. As a result, it is possible to realize a thin film transistor having such a preferable switching characteristic that: a leak current level is low in an OFF area, and a mobility is high. Thus, it is possible to readily realize a thin film transistor having a transparent semiconductor film.

In order to solve the foregoing problems, another thin film transistor of the present invention includes: a semiconductor layer made of ZnO, $Mg_x Zn_{1-x} O$, $Cd_x Zn_{1-x} O$ or CdO or ZnO, $Mg_x Zn_{1-x} O$, $Cd_x Zn_{1-x} O$ or CdO that have been doped with (a) an element that can be univalent or (b) Ni; and a gate insulating film, wherein the gate insulating film has: a first insulating film made of a material other than an oxide for constituting an interface in combination with a gate electrode; and a second insulating film, sandwiched between the first insulating film and the semiconductor layer, that has an oxide for constituting interfaces in combination with both the first insulating film and the semiconductor layer, and the second insulating film is made of $KNbO_3$, $KTaO_3$, $BaTiO_3$, $CaSO_3$, $CaZrO_3$, $CdSnO_3$, $SrHfO_3$, $SrSnO_3$, $SrTiO_3$, $YScO_3$, $CaHfO_3$, $MgCeO_3$, $SrCeO_3$, $BaCeO_3$, $SrZrO_3$, $BaZrO_3$, $LiGaO_2$, mixed crystal $(Li_{1-(x+y)}Na_xK_y)(Ga_{1-z}Al_z)O_2$ of $LiGaO_2$, or a solid solution including at least two of these oxides.

According to the arrangement, the oxide is used in the second insulating film, so that it is possible to keep the interface consistency under an extremely preferable condition. Particularly, as to the oxide and the solid solution, interstitial inconsistency is little with respect to ZnO etc. for constituting the second insulating film, so that it is possible to keep the interface consistency under an extremely preferable condition. Further, a material other than the oxide in the first insulating film is used, so that it is possible to further improve an insulating characteristic of the thin film transistor manufactured in a relatively low temperature range, at which an a-SiTFT process is performed, compared with the second insulating film using the oxide.

In this manner, the gate insulating film is constituted of two insulating films different from each other, so that it is possible to improve a crystalline characteristic of the semiconductor layer that constitutes the interface in combination with the second insulating film, and it is possible to decrease the defective level of the interface between the semiconductor layer and the second insulating film. Further, the second insulating film is constituted of the oxide, so that it is possible to restrain a material for the second insulating film from depriving oxygen of the semiconductor layer (ZnO etc.). Therefore, a crystalline characteristic of the semiconductor layer is kept under a preferable condition in the vicinity of the interface between the second insulating film and the semiconductor layer. As a result, it is possible to realize a thin film transistor having such a preferable switching characteristic that: a leak current level is low in an OFF area, and a mobility is high. Thus, it is possible to readily realize a thin film transistor having a transparent semiconductor film.

In the thin film transistor formed in a staggered manner, in a case where a light-shielding film is not required, there are formed a source electrode, a drain electrode, and a semiconductor layer on the substrate. Thus, some materials for the substrate have unfavorable lattice misfit with respect to a semiconductor, and this deteriorates a characteristic of the thin film transistor. Then, the semiconductor layer is formed on the base layer having the oxides or the solid solution thereof, so that the lattice consistency with respect to the semiconductor layer becomes preferable as in the second insulating film of the thin film transistor. Thus, the characteristic of the semiconductor layer is restrained from deteriorating regardless of the substrate material, so that it is not necessary to limit the substrate material to a material having the preferable lattice consistency with respect to the semiconductor layer.

In order to solve the foregoing problems, a matrix display device of the present invention includes switching elements disposed in a matrix manner, and is arranged so that any one of the foregoing thin film transistors is used as each of the switching elements.

By using the thin film transistor having high performance, a switching characteristic in the matrix display device is improved.

For a fuller understanding of the nature and advantages of the invention, reference should be made to the ensuing detailed description taken in conjunction with the accompanying drawings.

DESCRIPTION OF THE EMBODIMENTS

Embodiment 1

A first embodiment of the present invention is described as follows based on FIG. 1 through FIG. 3.

Figure 1:
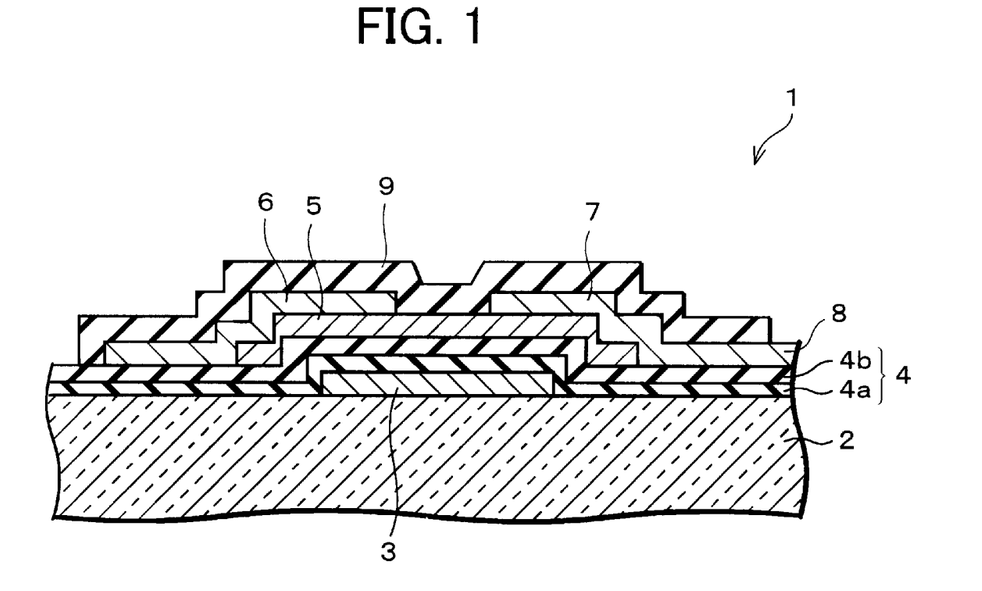
FIG. 1 is a sectional view showing a structure of a thin film transistor according to Embodiments 1 and 2 of the present invention.
Figure 2:
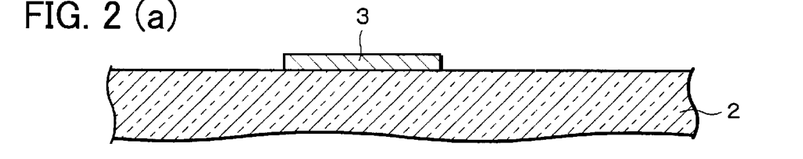
FIGS. 2(a) through (f) are sectional views showing manufacturing steps of the thin film transistors.

As shown in FIG. 1, a thin film transistor 1 according to the present embodiment is arranged so that: a semiconductor layer 5 is stacked, via a gate insulating film 4, on a gate electrode 3 formed on an insulating substrate 2, and a source electrode 6 and a drain electrode 7 are formed on both ends of the semiconductor layer 5, in an inversely-staggered manner. Further, in the thin film transistor 1, there is formed a picture element 8, connected to the drain electrode 7, on a second insulating film 4b, in a case of using the thin film transistor 1 for a matrix display device. Further, in the thin film transistor 1, there is formed a protecting film 9 for covering the semiconductor layer 5, the source electrode 6, and the drain electrode 7.

The semiconductor layer 5, which is transparent, is made of ZnO, $Mg_x Zn_{1-x}$ O, $Cd_x Zn_{1-x}$ O or CdO, or ZnO, $Mg_x Zn_{1-x}$ O, $Cd_x Zn_{1-x}$ O or CdO that have been doped with (a) an element that can be univalent or (b) Ni.

The gate insulating film 4 includes a first insulating film 4a and a second insulating film 4b.

The first insulating film 4a is stacked on the insulating substrate 2 and the gate electrode 3, and constitutes an interface in combination with the gate electrode 3. The first insulating film 4a is made of preferable insulating material other than an oxide, for example, made of $SiN_x$ (silicon nitride).

The second insulating film 4b is formed on the first insulating film 4a so as to be sandwiched between the first insulating film 4a and the semiconductor layer 5, and constitutes interfaces in combination with both the first insulating film 4a and the semiconductor layer 5. The second insulating film 4b is made of $SiO_2$, $Ta_2O_5$, $Al_2O_3$, $TiO_2$, MgO, $ZrO_2$, stab-$ZrO_2$, $CeO_2$, $K_2$ O, $Li_2$, O, $Na_2$ O, $Rb_2$ O, $In_2$ $O_3$, $La_2$ $O_3$, $Sc_2$ $O_3$, $Y_2O_3$, or a solid solution having at least two of these oxides.

Further, the second insulating film 4b may be arranged so that: oxides (first oxides) of IIa through VIIa group elements, and oxides (second oxides) obtained by mixing these oxides, or a solid solution including at least two of these oxides (first oxides and second oxides) constitute a single layer, or are stacked so as to constitute a plurality of layers. Alternately, the second insulating film 4b may be arranged so that: oxides (third oxides) of IIb through IVb group elements, and oxides (fourth oxides) obtained by mixing these oxides, or a solid solution including at least two of these oxides (third oxides and fourth oxides) constitute a single layer, or are stacked so as to constitute a plurality of layers.

Here, a manufacturing method of the thin film transistor 1 arranged in this manner is described as follows by using a manufacturing process chart of FIG. 2(a) through FIG. 2(f).

First, Ta is stacked on the insulating substrate 2 so as to have a 300 nm thickness as a gate electrode material, which constitutes the gate electrode 3, in accordance with sputtering. Then, a resist pattern is formed on the Ta, so as to have a predetermined shape, in accordance with a photo lithography process. The gate electrode material is subjected to dry etching with $CF_4+O_2$ gas by using the resist pattern. The gate electrode 3, that has been subjected to patterning so as to have the shape, and a gate wiring (not shown), connected to the gate electrode 3, are formed (FIG. 2(a)). As the insulating substrate 2, a glass substrate, quarts, plastic, and the like are used. Al, Cr, and the like are used, other than the Ta, as the gate electrode material.

Next, as the first insulating film 4a, a silicon nitride film is stacked in accordance with a P-CVD method so as to have a 400 nm thickness (FIG. 2(b)). At this time, a condition for forming the film is such that: a substrate temperature is 330° C., and a gas pressure is 1.5 Torr, and an RF power (sputter power) is 1.5 kW, and a flow volume of gas is $SiH_4/NH_3/N_2$=150/750/2000 sccm.

Note that, the forming method of the silicon nitride film may be realized also in accordance with sputtering method.

Further, as the second insulating film 4b, an $SiO_2$ thin film is stacked in accordance with the sputtering method so as to have a 10 nm thickness (FIG. 2(c)). The $SiO_2$ thin film is formed under such condition that: a substrate temperature upon forming the $SiO_2$ thin film is 200° C., and a flow volume of gas is oxygen/argon=40/80 sccm, a pressure is 0.7 Pa, and an RF power is 4 kW.

Then, ZnO is stacked as the semiconductor material in accordance with the sputtering method so as to have a 200 nm thickness. The ZnO is processed so as to have an island shape above the gate electrode 3 (FIG. 2(d)). As the forming method of the ZnO, it is possible to employ any method such as a pulse laser sedimentation method, a liquid phase precipitation method, and a solgel method.

Next, the Ta is formed in accordance with the sputtering method so as to have a 200 nm thickness. The source electrode 6 and the drain electrode 7 are formed in accordance with dry etching with a photolithography and $CF_4+O_2$ gas. Further, an ITO (Indium Tin Oxide) is formed in accordance with the sputtering method so as to have a 100 nm thickness. Then, a picture element electrode 8 is formed on the second insulating film 4b, in accordance with wet etching using a photolithography and an etching solution (hydrochloric acid and nitric acid), so as to be connected to the drain electrode 7 (FIG. 2(e)).

Lastly, a silicon nitride thin film is formed in accordance with a P-CVD method so as to have a 300 nm thickness. By removing a portion on the picture element electrode 8 and a terminal pad (not shown) of the silicon nitride film in accordance with the photolithography and the dry etching, the protecting film 9 is formed, so that the formation of the thin film transistor 1 is completed (FIG. 2(f)).

Figure 3:
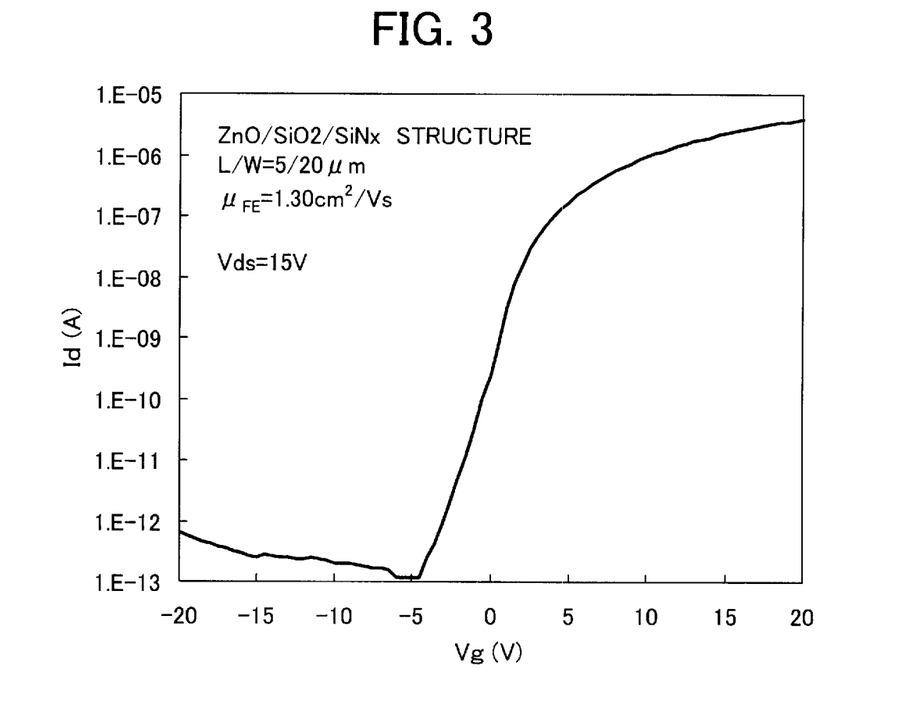
FIG. 3 is a graph showing a Vg-Id characteristic of an example of the thin film transistor.

FIG. 3 shows a Vg-Id characteristic of the thin film transistor manufactured in the foregoing manner. Further, FIG. 10 shows a Vg-Id characteristic of a conventional thin film transistor as a comparative example. A channel size of the thin film transistors is L/W=5/20 μm.

In the interface between the gate insulating film ($SiN_x$) and the semiconductor layer (ZnO) of the conventional thin film transistor, the gate insulating film forms an oxide layer by partially absorbing oxygen in the semiconductor layer, so that this may result in oxygen deficit of the semiconductor layer. Thus, as shown in FIG. 10, the thin film transistor has a small field effect mobility ($\mu$FE) such as 0.52 cm$^2$/Vs.

On the other hand, in the present thin film transistor 1, as shown in FIG. 1, the second insulating film 4b constituting the interface in combination with the semiconductor layer 5 (ZnO) is an oxide, so that there occurs no oxygen deficit and its characteristic is improved. Specifically, as shown in FIG. 3, the field effect mobility of the thin film transistor 1 is improved to 1.3 cm$^2$/Vs.

Further, since a thickness of the second insulating film 4b (for example, SiO$_2$) is thin such as 10 nm, this does not exhibit much insulating characteristic. However, since the first insulating film 4a (SiN$_x$) exhibits high insulating characteristic, a leak current from the gate electrode 3 is restricted low, so that it is possible to obtain a preferable characteristic.

As described above, the thin film transistor 1 according to the present embodiment includes the gate insulating film 4 having: the first insulating film 4a whose insulating characteristic is high; and the second insulating film 4b having an oxide which does not deprive oxygen of the semiconductor layer 5 (ZnO etc.). Thus, it is possible to improve (a) an insulating characteristic of the gate insulating film 4 and (b) a characteristic of the interface between the gate insulating film 4 and the semiconductor layer 5. As a result, it is possible to realize a thin film transistor 1 such that: a leak current level at an OFF area is low, and the mobility is high, and a switching characteristic is preferable.

The SiN used as a material for the first insulating film 4a exhibits a higher insulating characteristic than a typical oxide insulating film even though it is formed at a low temperature (approximately 300° C.). Further, SiN$_x$ has low moisture permeability, so that it is possible to keep the reliability of the device. The SiN$_x$ can restrict movable ion which causes a device characteristic to deteriorate better than the SiO$_2$ used as the material for the second insulating film 4b. Thus, the SiN$_x$ is sued as the material for the first insulating film 4a, so that it is possible to obtain a thin film transistor having a higher performance and a higher reliability than the thin film transistor using a gate insulating film, made of the SiO$_2$, which has a single layer.

Embodiment 2

A second embodiment is described as follows based on FIG. 1 and FIG. 4. Note that, in the present embodiment, the same reference signs are given to components having the same functions as the components of Embodiment 1, and description thereof is omitted.

A thin film transistor 1 according to the present embodiment is arranged as shown in FIG. 1, but is different from the thin film transistor 1 of Embodiment 1 in terms of materials for forming the semiconductor layer 5 and the second insulating film 4b of the gate insulating film 4.

The material for the semiconductor layer 5 is made of ZnO, Mg$_x$Zn$_{1-x}$O, Cd$_x$Zn$_{1-x}$O or CdO, or ZnO, Mg$_x$Zn$_{1-x}$O, Cd$_x$Zn$_{1-x}$O or CdO that have been doped with (a) an element that can be univalent or (b) Ni. Further, the material for the second insulating film 4b is made of KNbO$_3$, KTaO$_3$, BaTiO$_3$, CaSO$_3$, CaZrO$_3$, CdSnO$_3$, SrHfO$_3$, SrSnO$_3$, SrTiO$_3$, YScO$_3$, CaHfO$_3$, MgCeO$_3$, SrCeO$_3$, BaCeO$_3$, SrZrO$_3$, BaZrO$_3$, LiGaO$_2$, mixed crystal (Li$_{1-(x+y)}$Na$_x$K$_y$)(Ga$_{1-z}$Al$_z$)O$_2$ of LiGaO$_2$, or a solid solution having at least two of these oxides.

A manufacturing method of the thin film transistor 1 arranged in this manner is described as follows by using the manufacturing process chart of FIG. 2(a) through FIG. 2(f).

The steps of forming the gate electrode 3 and the first insulating film 4a on the insulating substrate 2 (FIGS. 2(a) and (b)) are performed as in Embodiment 1.

In the next step of forming the second insulating film 4b (FIG. 2(c)), as a material which hardly brings about lattice misfit with respect to ZnO etc., a thin film of CaZrO$_3$, for example, is stacked in accordance with a pulse laser deposition method so as to have a 10 nm thickness. At this time, a condition for forming the film is such that: a substrate temperature is 300° C., and an oxygen atmosphere is 10 mTorr, and a laser power is 150 mV, 5 Hz.

Further, in a step of forming the semiconductor layer 5 (FIG. 2(d)), a transparent semiconductor film made of ZnO for example is stacked in accordance with the pulse laser deposition method so as to have a 200 nm thickness. This formation is performed under such condition that: a substrate temperature is 300° C., and an oxygen atmosphere is 100 mTorr, and a laser power is 100 mV, 10 Hz.

The next steps from forming the drain electrode 6 and the source electrode 7 to forming the protecting film 9 (FIGS. 2(e) and FIG. 2(f)) are performed as in Embodiment 1.

Figure 4:
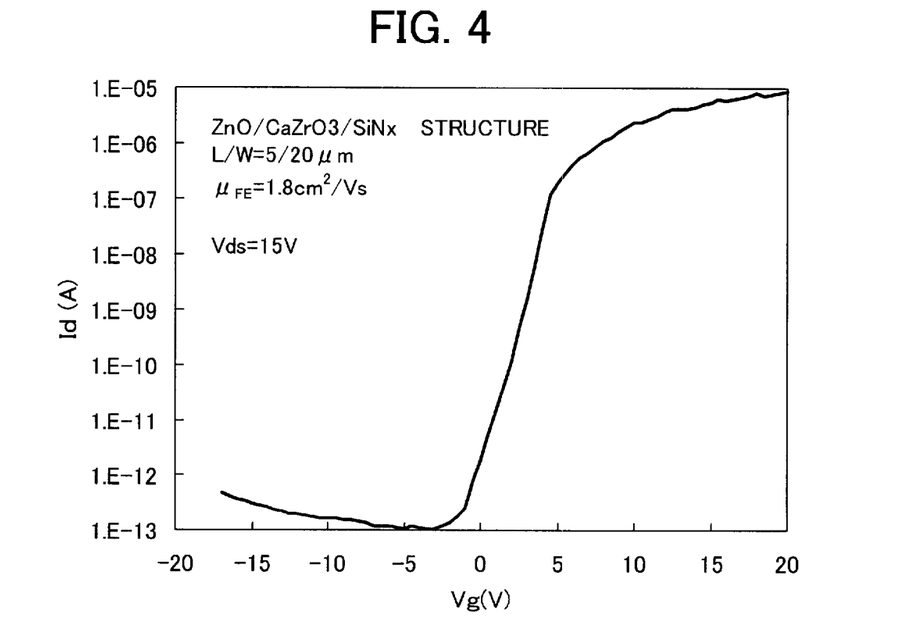
FIG. 4 is a graph showing a Vg-Id characteristic of an example of the thin film transistor according to Embodiment 2 of the present invention.

FIG. 4 shows a Vg-Id characteristic of the thin film transistor manufactured in the foregoing manner.

In the present thin film transistor 1, a lattice constant of the second insulating film 4b which functions as a base film for constituting the interface in combination with the semiconductor layer 5 (ZnO) is substantially equal to a lattice constant of ZnO, so that a crystalline characteristic is improved. As a result, the field effect mobility ($\mu$FE) of the thin film transistor 1 is improved to 1.8 cm$^2$/Vs.

Further, the second insulating film 4b is stacked so as to have a 30 nm thickness, so that the field effect mobility is improved to 3.3 cm$^2$/Vs.

Here, each of the foregoing materials for the second insulating film 4b has a perovskite structure, so that inconsistency of the lattice constant in a (111) face is mentioned. As a result of calculation performed in accordance with ZnO and the respective lattice constants, the inconsistency of the respective materials is approximately 2% at the maximum, so that this result shows that the consistency of ZnO and the lattice constant is high. Thus, when ZnO is formed as the semiconductor layer 5 on the second insulating film 4b formed by using such materials, the crystalline characteristic of the semiconductor layer 5 is improved, so that it is possible to form a high-quality semiconductor thin film. Therefore, the thin film transistor manufactured in this manner has a superior characteristic, so that it is possible to improve the mobility.

Thus, it is possible to miniaturize the thin film transistor 1 so as to be suitable for use in a switching element for a picture element of a matrix display device. Further, as described later, it is possible to apply this to a driving element of the thin film transistor 1 disposed on a flat surface in a matrix manner, and it is possible to manufacture it while manufacturing the switching element in the picture element simultaneously.

Embodiment 3

The third embodiment is described as follows based on FIG. 5 through FIG. 7. Note that, in the present embodiment, the same reference signs are given to components having the same functions as the components of Embodiment 1, and description thereof is omitted.

Figure 5:
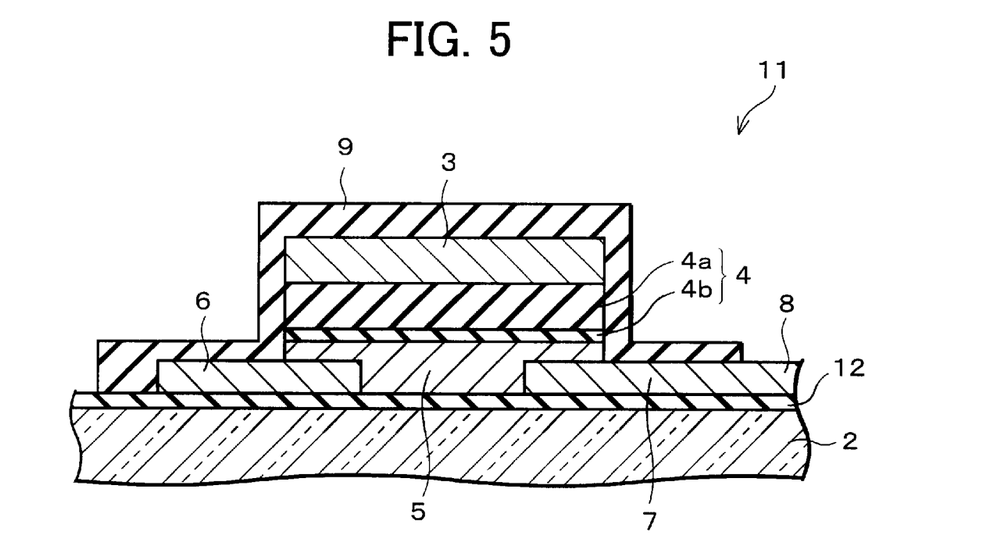
FIG. 5 is a sectional view showing a structure of a thin film transistor according to Embodiment 3 of the present invention.
Figure 6:
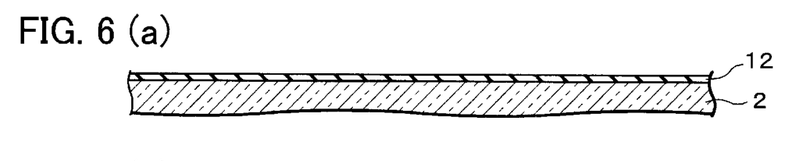
FIGS. 6(a) through (g) are sectional views showing manufacturing steps of the thin film transistors.

As shown in FIG. 5, a thin film transistor 11 according to the present embodiment is arranged so that: there are formed the gate electrode 6, the source electrode 7, and the semiconductor layer 5 connected thereto, on the insulating substrate 2, and the gate electrode 3 is formed above the semiconductor layer 5 so that the gate insulating film 4 is provided therebetween, so that the thin film transistor 11 is formed in a staggered manner. In the thin film transistor 11, it is noteworthy that: the gate electrode 6, the source electrode 7, and the semiconductor layer 5 are provided not on the insulating substrate 2 directly, but on a base insulating film 12 (base layer) provided on the insulating substrate 2 so that the base insulating film 12 is sandwiched therebetween.

The base insulating film 12 is made of $KNbO_3$, $KTaO_3$, $BaTiO_3$, $CaSnO_3$, $CaZrO_3$, $CdSnO_3$, $SrHfO_3$, $SrSnO_3$, $SrTiO_3$, $YScO_3$, $CaHfO_3$, $MgCeO_3$, $SrCeO_3$, $BaCeO_3$, $SrZrO_3$, $BaZrO_3$, $LiGaO_2$, mixed crystal $(Li_{1-(x+y)}Na_xK_y)(Ga_{1-z}Al_z)O_2$ of $LiGaO_2$, or a solid solution having at least two of these oxides.

Further, in case of using the thin film transistor 11 in a matrix display device, a picture element electrode 8 connected to the drain electrode 7 is formed on the base insulating layer 12. Further, in the thin film transistor 11, there is formed the protecting film for covering the gate electrode 3, the gate insulating film 4, the semiconductor layer 5, the source electrode 6, and the drain electrode 7.

Here, a manufacturing method of the thin film transistor 11 arranged in the foregoing manner is described by using a manufacturing process chart of FIG. 6(a) through FIG. 6(g).

First, as a material for the base insulating film 12, $CaHfO_3$ is stacked in accordance with the sputtering method so as to have a 10 nm thickness (FIG. 6(a)). This formation is performed under such condition that: a temperature is 200° C., and a flow volume of gas is oxygen/argon=40/60 sccm, and a pressure is 0.7 Pa.

Next, ITO (Indium Tin Oxide) is formed on the base insulating film 12 in accordance with the sputtering method so as to have a 100 nm thickness. Then, the source electrode 6, the drain electrode 7, and the picture element electrode 8 are simultaneously formed on the ITO film, in accordance with wet etching using a photolithography and an etching solution (hydrochloric acid and nitric acid) (FIG. 6(b)).

Next, a ZnO film 51 made of ZnO is stacked as the semiconductor material in accordance with the sputtering method so as to have a 200 nm thickness (FIG. 6(c)). This formation is performed under such condition that: a substrate temperature is 280° C., and a flow volume of gas is oxygen/argon=40/80 sccm, and a pressure is 0.7 Pa. As the method for forming the ZnO film, it is possible to employ any method such as a pulse laser sedimentation method, a liquid phase precipitation method, and a solgel method.

In addition, an $SiO_2$ thin film 41 which functions as the second insulating film 4b is stacked in accordance with the sputtering method so as to have a 10 nm thickness (FIG. 6(d)). The $SiO_2$ thin film 41 is formed under such condition that: a substrate temperature is 200° C., and a flow volume of gas is oxygen/argon=40/60 sccm, a pressure is 0.7 Pa.

Further, a silicon nitride thin film 42 which functions as the first insulating film 4a is formed in accordance with a P-CVD method so as to have a 400 nm thickness. Then, a Ta film 31 which functions as the gate electrode 3 is formed on the silicon nitride thin film 42 in accordance with the sputtering method so as to have a 300 nm thickness (FIG. 6(e)).

The silicon nitride film 42 is formed under such condition that: a substrate temperature is 330° C., and a gas pressure is 1.5 Torr, and an RF power (sputter power) is 1.5 kW, and a flow volume of gas is $SiH_4/NH_3/N_2$=150/750/2000 sccm.

Note that, the forming method of the silicon nitride film 42 may be realized also in accordance with sputtering method.

Thereafter, a resist of a gate pattern is formed on the Ta film 31 in accordance with a photo lithography process. The Ta film 31, the silicon nitride film 42, the $SiO_2$ film 41, and the ZnO film 51 are subjected to patterning so as to form the gate electrode 3, the gate insulating film 4, and the semiconductor film 5 (FIG. 6(f)). At this time, the Ta film 31 and the silicon nitride film 42 are subjected to patterning in accordance with dry etching by using $CF_4+O_2$ gas. Then, the $SiO_2$ film 41 and the ZnO film 51 are subjected to wet etching using a mixture solution made up of hydrofluoric acid and nitric acid.

Lastly, a silicon nitride thin film is formed in accordance with a P-CVD method so as to have a 300 nm thickness. By removing a portion on the picture element 8 and a terminal pad (not shown) of the silicon nitride film in accordance with the photolithography and the dry etching, the protecting film 9 is formed, so that the formation of the thin film transistor 11 is completed (FIG. 6(g)).

In the thin film transistor 11 formed in a staggered manner, the semiconductor layer 5 (ZnO) is formed on the base insulating substrate 12. The base insulating film 12 is an oxide, used as a material for the second insulating film 4b of Embodiment 2, which has preferable lattice consistency with respect to ZnO, and so that the interface between the semiconductor layer 5 and the base insulating film 12 is improved. Thus, also in the thin film transistor 11 formed in a staggered manner, it is possible to improve a crystalline characteristic of the semiconductor layer 5.

Further, even though a material for the insulating substrate 2 does not have preferable lattice consistency with respect to the semiconductor layer 5, a characteristic of the semiconductor layer 5 is restrained from deteriorating by providing the base insulating film 12. Thus, it is not necessary to limit the material for the substrate to a material having the preferable lattice consistency with respect to the semiconductor layer 5.

Figure 7:
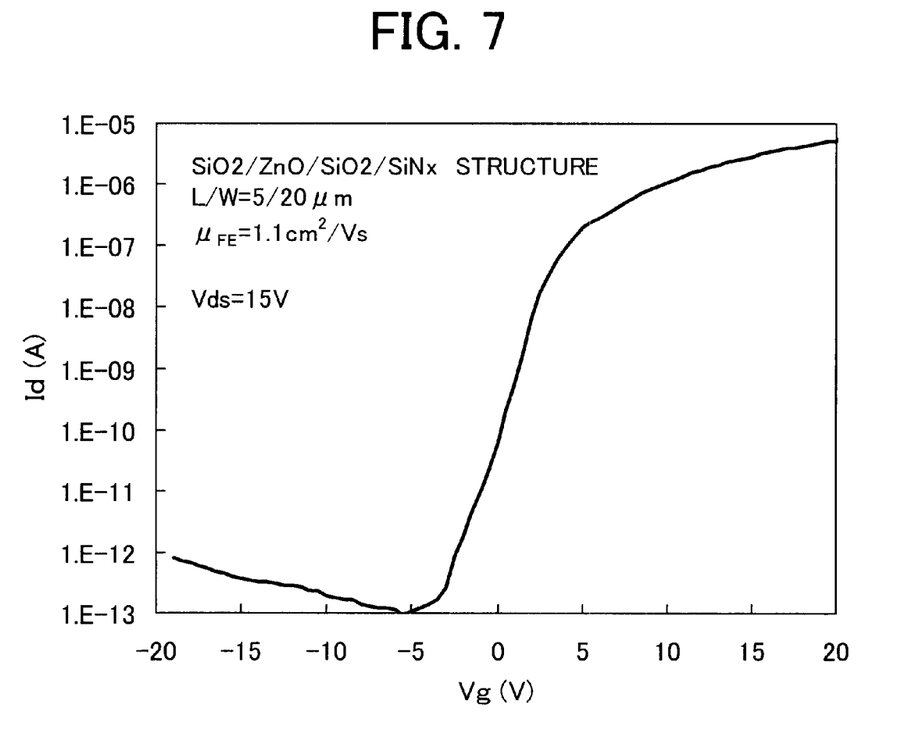
FIG. 7 is a graph showing a Vg-Id characteristic of an example of the thin film transistor according to Embodiment 3 of the present invention.

Here, FIG. 7 shows a Vg-Id characteristic of the thin film transistor 11 manufactured in the foregoing manner. A channel size of the thin film transistor 11 is L/W=5/20 μm. The thin film transistor 11 has a high field effect mobility such as 1.1 $cm^2$/Vs.

Each of the thin film transistors 1 and 11 in the foregoing Embodiments shows a switching characteristic in which the mobility, the ON/OFF ratio, and the like are preferable, so that it is possible to obtain an effect equal to, or superior to an effect of a current a-SiTFT that is widely used in a liquid crystal display. Further, depending on the film-forming condition of the insulating film (second insulating film 4b or base insulating film 12) which constitutes the interface in combination with ZnO, it is possible to obtain high mobility (several $cm^2$/Vs) as described at the last of Embodiment 2. Thus, it is possible to miniaturize the thin film transistors 1 and 11 as a switching element of a liquid crystal display.

Note that, in Embodiments 1 through 3, the description is given on the manufacturing steps of the thin film transistors 1 and 11 (FIG. 2(a) through FIG. 2(f), and FIG. 6(a) through FIG. 6(g)). In this description, examples of using specific materials are illustrated. However, the thin film transistors 1 and 11, that have been manufactured by using the respective materials shown as examples in the respective Embodiments, have an improved performance, as in the thin film transistors 1 and 11, that have been manufactured by using the specific materials.

Embodiment 4

The fourth embodiment is described as follows based on FIG. 8 and FIG. 9. Note that, the same reference signs are given to components having the same functions as the components of Embodiments 1 and 3, and description thereof is omitted.

Figure 8:
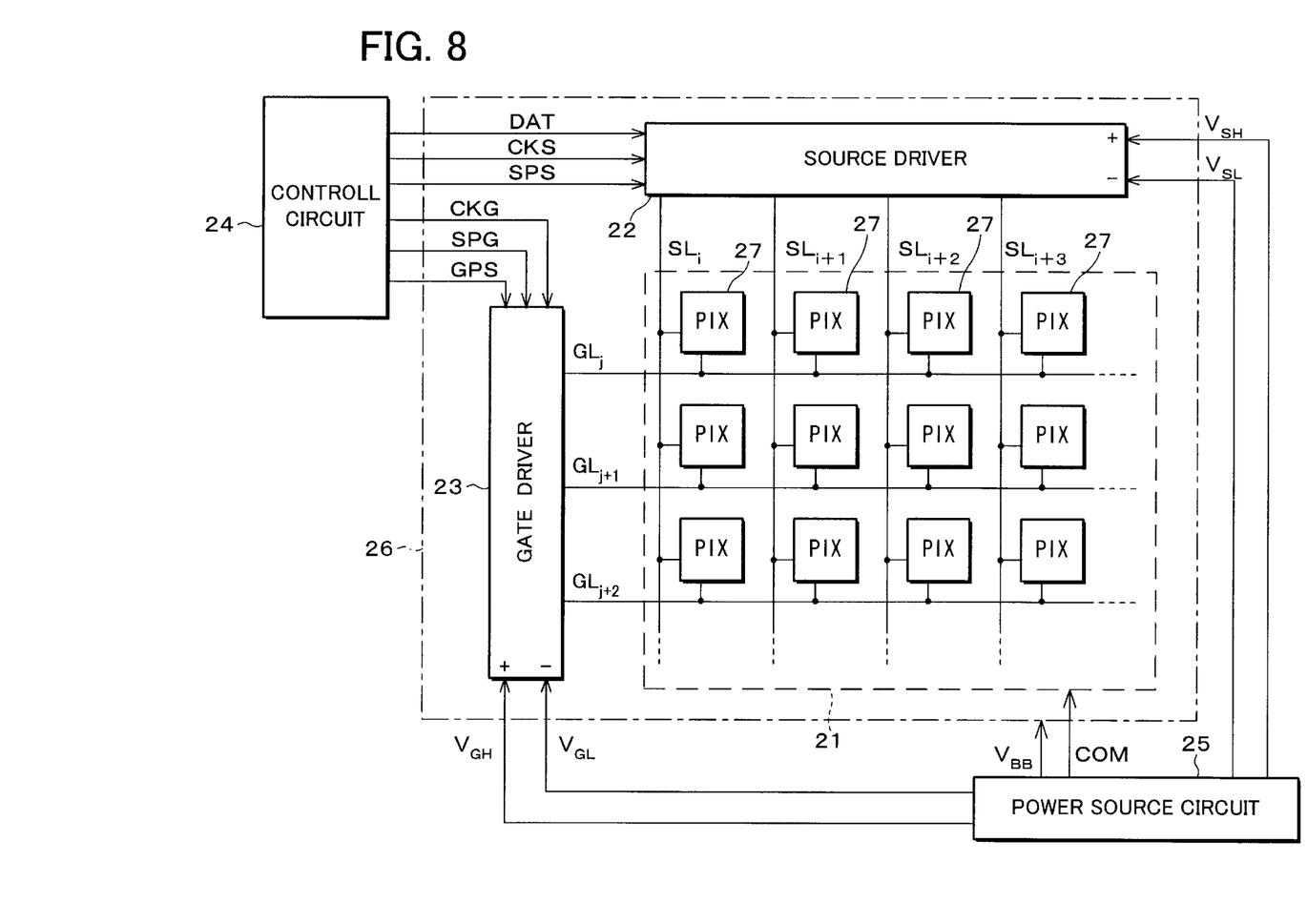
FIG. 8 is a block diagram showing a structure of an important portion of a matrix display device according to Embodiment 4 of the present invention.

As shown in FIG. 8, a matrix display device according to the present embodiment is a liquid crystal display, and includes: a picture element array 21; a source driver 22; a gate driver 23; a control circuit 24; and a power source circuit 25.

The picture element array 21, the source driver 22, and the gate driver 23 are formed on a substrate 26. The substrate 26 is formed by using a material having an insulating characteristic and translucency like a glass. The picture element array 21 includes: source lines SL . . . ; gate lines GL . . . ; and picture elements 27 . . .

In the picture element array 21, a large number of gate lines $GL_j$, $GL_{j+1}$ . . . and a large number of source lines $SL_i$, $SL_{i+1}$ . . . are provided so as to be crossed with each other. The picture element (shown as PIX in FIG. 8) 27 at a portion surrounded by (a) two gate lines GL and GL that are adjacent to each other and (b) two source lines SL and SL that are adjacent to each other. In this manner, the picture elements 27 . . . are disposed in the picture element array 21 in a matrix manner. Each source line SL is allotted to each column, and each gate line GL is allotted to each row.

Figure 9:
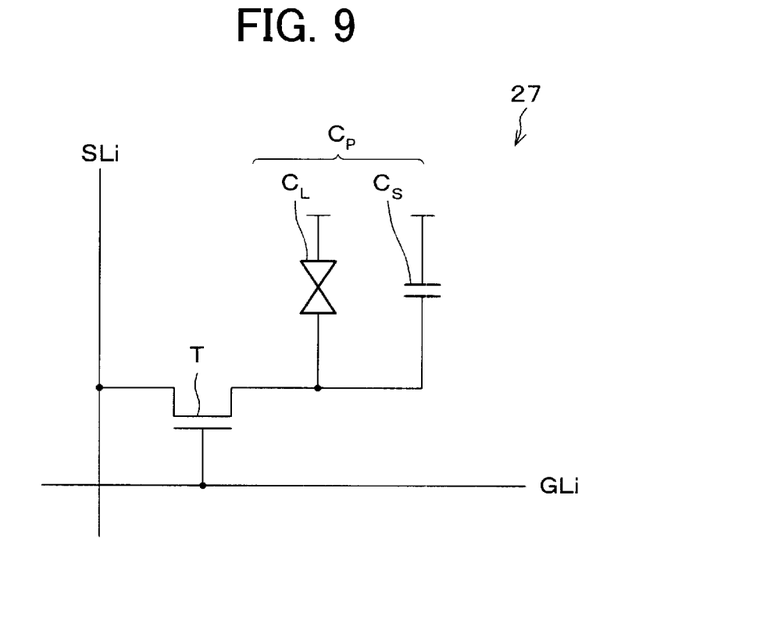
FIG. 9 is a circuit diagram showing a structure of a picture element of the matrix display device.

In a case of a liquid crystal display, as shown in FIG. 9, each picture element 21 includes: a transistor T which functions as a switching element; and a picture element capacitor $C_P$ having a liquid crystal capacitor $C_L$. Generally, the picture element capacitor $C_P$ of an active matrix liquid crystal display device has an auxiliary capacitor $C_S$ provided in parallel to the liquid crystal capacitor $C_L$ so as to stabilize the display. The auxiliary capacitor $C_S$ is required in minimizing the following influences: (a) fluctuation of a picture element potential that is caused by parasitic capacitance such as leak currents of the liquid crystal capacitor $C_L$ and the transistor T, capacitance between a gate and a source of the transistor T, and capacitance between a picture element electrode and a signal line; and (b) display data dependency of the liquid crystal capacitor $C_L$, and the like.

The gate of the transistor T is connected to the gate line $GL_j$. Further, the one electrode of the liquid crystal capacitor $C_L$ and the one electrode of the auxiliary capacitor $C_S$ are connected to a source line $SL_i$ via the drain and the source of the transistor T. The other electrode of the liquid crystal capacitor $C_L$ is connected to a counter electrode so that a liquid crystal cell is sandwiched therebetween, and the other electrode of the auxiliary capacitor $C_S$ is connected to a common electrode line (not shown)(in a case of Cs on Common structure) that is shared by all the picture elements, or the other electrode of the auxiliary capacitor $C_S$ is connected to the gate line GL (in a case of Cs on Gate structure) that is adjacent to the gate line $GL_j$.

The large number of gate lines $GL_j$, $GL_{j+1}$ . . . are connected to the gate driver 23, and the large number of source lines $SL_i$, $SL_{i+1}$ . . . are connected to the source driver 22. Further, the gate driver 23 and the source driver 22 are driven by power voltages $V_{GH}/V_{GL}$ and power voltages $V_{SH}/V_{SL}$ that are different from each other.

The source driver 22 performs sampling with respect to an image signal DAT given by a control circuit 24, in accordance with a synchronized signal CKS and a start pulse SPS from the control circuit 24, so that the source driver 22 outputs the image signal DAT, that has been subjected to the sampling, to the source lines $SL_i$, $SL_{i+1}$ . . . connected to pixels of the respective columns. The gate driver 23 generates gate signals so that the gate signals are applied to the gate lines $GL_j$, $GL_{j+1}$ . . . connected to the picture elements of the respective rows in accordance with the synchronized signal CKS and the start pulse SPS from the control circuit 24.

The power source circuit 25 generates: the power voltages $V_{SH}$, $V_{SL}$, $V_{GH}$, and $V_{GL}$; a ground potential COM; and a voltage $V_{BB}$. The power voltages $V_{SH}$ and $V_{SL}$ are different from each other in terms of level, and they are applied to the source driver 23. The power voltages $V_{GH}$ and $V_{GL}$ are different from each other in terms of level, and they are applied to the gate driver 23. The ground potential COM is applied to the common electrode line (not shown) provided on the substrate 26.

Here, the transistor T is the thin film transistor 1 or the thin film transistor 11 (see FIG. 1 and FIG. 5) described in Embodiments 1 through 3. Each of the thin film transistors 1 and 11 has high mobility and high performance, so that it is possible to provide a matrix display device superior in an operation speed and a display quality by using each of the thin film transistors 1 and 11 as the transistor T for driving the picture element 27.

Some circuit elements constitute the gate driver 23 whose operation frequency is relatively low. Particularly, in a circuit of the circuit elements which is constituted of transistors, the thin film transistors 1 and 11 are used as respective transistors. This is enabled because each of the thin film transistors 1 and 11 has high performance (high mobility).

Further, the same thin film transistors 1 and 11 are used to constitute the transistor T of the picture element 27 and a transistor of a driving circuit, so that it is possible to provide the transistors on the same substrate 26 by using the same process at the same time. Therefore, the number of the manufacturing steps of the matrix display device is decreased, so that it is possible to decrease a manufacturing cost of the matrix display device.

As described above, the thin film transistors 1 and 11 are used as the transistor T for the picture element 27 and the transistor for the driving circuit, so that it is possible to provide a matrix display device, that is superior in an operation speed and a display quality, at a low cost.

As described above, a thin film transistor of Embodiment 1 includes: a semiconductor layer made of ZnO, $Mg_x Zn_{1-x} O$, $Cd_x Zn_{1-x} O$ or CdO or ZnO, $Mg_x Zn_{1-x} O$, $Cd_x Zn_{1-x} O$ or CdO that have been doped with (a) an element that can be univalent or (b) Ni; and a gate insulating film, wherein the gate insulating film has: a first insulating film made of a material other than an oxide for constituting an interface in combination with a gate electrode; and a second insulating film, sandwiched between the first insulating film and the semiconductor layer, that has an oxide for constituting interfaces in combination with both the first insulating film and the semiconductor layer.

In this manner, the gate insulating film is constituted of two insulating films different from each other, so that it is possible to improve a crystalline characteristic of the semiconductor layer that constitutes the interface in combination with the second insulating film, and it is possible to decrease the defective level of the interface between the semiconductor layer and the second insulating film. Further, the second insulating film is constituted of the oxide, so that it is possible to restrain a material for the second insulating film from depriving oxygen of the semiconductor layer. Therefore, a crystalline characteristic of the semiconductor layer is kept under a preferable condition in the vicinity of the interface between the second insulating film and the semiconductor layer. As a result, it is possible to realize a thin film transistor having such a preferable switching characteristic that: a leak current level is low in an OFF area, and a mobility is high. This brings about such effect that: it is possible to readily improve the performance of the thin film transistor having a transparent semiconductor film.

In the thin film transistor, the second insulating film is made of $SiO_2$, $Ta_2O_5$, $Al_2O_3$, $TiO_2$, MgO, $ZrO_2$, stab-$ZrO_2$, $CeO_2$, $K_2O$, $Li_2$, O, $Na_2$ O, $Rb_2$ O, $In_2$ $O_3$, $La_2$ $O_3$, $Sc_2$ $O_3$, $Y_2O_3$, or a solid solution having at least two of these oxides, so that the material for the second insulating film hardly deprives oxygen of the semiconductor layer. This bring about such effect that: it is possible to provide the thin film transistor having superior performance.

The thin film transistor of Embodiment 2 includes: a semiconductor layer made of ZnO, $Mg_x$ $Zn_{1-x}$ O, $Cd_x$ $Zn_{1-x}$ O or CdO or ZnO, $Mg_x$ $Zn_{1-x}$ O, $Cd_x$ $Zn_{1-x}$ O or CdO that have been doped with (a) an element that can be univalent or (b) Ni; and a gate insulating film, wherein the gate insulating film has: a first insulating film made of a material other than an oxide for constituting an interface in combination with a gate electrode; and a second insulating film, sandwiched between the first insulating film and the semiconductor layer, that has an oxide for constituting interfaces in combination with both the first insulating film and the semiconductor layer, and the second insulating film is made of $KNbO_3$, $KTaO_3$, $BaTiO_3$, $CaSO_3$, $CaZrO_3$, $CdSnO_3$, $SrHfO_3$, $SrSnO_3$, $SrTiO_3$, $YScO_3$, $CaHfO_3$, $MgCeO_3$, $SrCeO_3$, $BaCeO_3$, $SrZrO_3$, $BaZrO_3$, $LiGaO_2$, mixed crystal $(Li_{1-(x+y)}Na_xKy)(Ga_{1-z}Al_z)O_2$ of $LiGaO_2$, or a solid solution having at least two of these oxides.

In this manner, the gate insulating film is constituted of two insulating films different from each other, so that it is possible to improve a crystalline characteristic of the semiconductor layer that constitutes the interface in combination with the second insulating film, and it is possible to decrease the defective level in the interface between the semiconductor layer and the second insulating film. Particularly, the oxides and the solid solution have small lattice consistency with respect to ZnO etc. for constituting the second insulating film, so that it is possible to keep the interface consistency under an extremely preferable condition. Further, the second insulating film is constituted of the foregoing oxides, so that the material for the second insulating film hardly deprives oxygen of the semiconductor layer. Therefore, a crystalline characteristic of the semiconductor layer is kept under a preferable condition in the vicinity of the interface between the second insulating film and the semiconductor layer. As a result, it is possible to realize a thin film transistor having such a preferable switching characteristic that: a leak current level is low in an OFF area, and a mobility is high. This brings about such effect that: it is possible to readily improve the performance of the thin film transistor having a transparent semiconductor film.

In the respective thin film transistors, it is preferable that $SiN_x$ is used in the first insulating film. $SiN_x$ has the following advantages: (1) $SiN_x$ exhibits a high insulating characteristic even when $SiN_x$ has a relatively low temperature with respect to an oxide insulating film, (2) moisture permeability is so low that it is possible to keep the reliability of the device, and (3) it is possible to restrict movable ion better than $SiO_2$. Thus, $SiN_x$ can give a preferable insulating characteristic to the gate insulating film.

Therefore, it is possible to secure an insulating characteristic of the gate insulating film sufficiently even though the second insulating film is made thin. Thus, it is possible to avoid making the thin film transistor larger, while preventing a thickness of the gate insulating film made up of two different insulating films from increasing.

In the respective thin film transistors, it is preferable that the thin film transistor further includes a base layer having the semiconductor layer thereon, wherein the base layer is made of $KNbO_3$, $KTaO_3$, $BaTiO_3$, $CaSnO_3$, $CaZrO_3$, $CdSnO_3$, $SrHfO_3$, $SrSnO_3$, $SrTiO_3$, $YScO_3$, $CaHfO_3$, $MgCeO_3$, $SrCeO_3$, $BaCeO_3$, $SrZrO_3$, $BaZrO_3$, $LiGaO_2$, mixed crystal $(Li_{1-(x+y)}Na_xK_y)(Ga_{1-z}Al_z)O_2$ of $LiGaO_2$, or a solid solution having at least two of these oxides, so that the thin film transistor is formed in a staggered manner (Embodiment 3).

Thus, the lattice consistency with respect to the semiconductor layer becomes preferable as in the second insulating film of the thin film transistor. Therefore, the characteristic of the semiconductor layer is prevented from deteriorating regardless of the substrate material, so that it is not necessary to limit the substrate material to a material having the preferable lattice consistency with respect to the semiconductor layer. Thus, it is possible to readily improve the performance of the thin film transistor having a transparent semiconductor film.

The matrix display device of Embodiment 4 includes switching elements disposed in a matrix manner, and is arranged so that any one of the foregoing thin film transistors is used as each of the switching elements. Thus, a switching characteristic in the matrix display device is improved.

In the matrix display device, it is preferable to provide a driving circuit for driving the switching element, and any one of the foregoing thin film transistors is used as a transistor that constitutes the driving circuit, and the switching element and the transistor are simultaneously provided.

Thus, the manufacturing steps of the matrix display device are decreased. Therefore, it is possible to decrease a manufacturing cost of the matrix display device.

Although some examples are illustrated in the present embodiment and other embodiments, the present invention is not limited to the respective embodiments, but the present invention can be applied to all structures based on the same ideas.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

What is claimed is:

1. A thin film transistor comprising:
    a semiconductor layer made of ZnO, $Mg_x$ $Zn_{1-x}$ O, $Cd_x$ $Zn_{1-x}$ O or CdO or ZnO, $Mg_x$ $Zn_{1-x}$ O, $Cd_x$ $Zn_{1-x}$ O or CdO that have been doped with (a) an element that can be univalent or (b) Ni; and
    a gate insulating film, wherein
        the gate insulating film includes:
            a first insulating film made of a material other than an oxide for constituting an interface in combination with a gate electrode; and
            a second insulating film, sandwiched between the first insulating film and the semiconductor layer, that is made of an oxide for constituting interfaces in combination with both the first insulating film and the semiconductor layer.

2. The thin film transistor as set forth in claim 1, further comprising a base layer having the semiconductor layer thereon, wherein the base layer is made of $KNbO_3$, $KTaO_3$, $BaTiO_3$, $CaSnO_3$, $CaZrO_3$, $CdSnO_3$, $SrHfO_3$, $SrSnO_3$, $SrTiO_3$, $YScO_3$, $CaHfO_3$, $MgCeO_3$, $SrCeO_3$, $BaCeO_3$, $SrZrO_3$, $BaZrO_3$, $LiGaO_2$, mixed crystal $(Li_{1-(x+y)}Na_xK_y)(Ga_{1-z}Al_z)O_2$ of $LiGaO_2$, or a solid solution having at least two of these oxides, so as to constitute the thin film transistor in a staggered manner.

3. The thin film transistor as set forth in claim 1, wherein the first insulating film is made of $SiN_x$.

4. The thin film transistor as set forth in claim 3, further comprising a base layer having the semiconductor layer thereon, wherein the base layer is made of $KNbO_3$, $KTaO_3$, $BaTiO_3$, $CaSnO_3$, $CaZrO_3$, $CdSnO_3$, $SrHfO_3$, $SrSnO_3$, $SrTiO_3$, $YScO_3$, $CaHfO_3$, $MgCeO_3$, $SrCeO_3$, $BaCeO_3$, $SrZrO_3$, $BaZrO_3$, $LiGaO_2$, mixed crystal $(Li_{1-(x+y)}Na_xK_y)(Ga_{1-z}Al_z)O_2$ of $LiGaO_2$, or a solid solution having at least two of these oxides, so as to constitute the thin film transistor in a staggered manner.

5. The thin film transistor as set forth in claim 1, wherein the second insulating film is made of $SiO_2$, $Ta_2O_5$, $Al_2O_3$, $TiO_2$, MgO, $ZrO_2$, stab-$ZrO_2$, $CeO_2$, $K_2O$, $Li_2O$, $Na_2O$, $Rb_2O$, $In_2O_3$, $La_2O_3$, $Sc_2O_3$, $Y_2O_3$, or a solid solution having at least two of these oxides.

6. The thin film transistor as set forth in claim 5, wherein the first insulating film is made of $SiN_x$.

7. The thin film transistor as set forth in claim 5, further comprising a base layer having the semiconductor layer thereon, wherein the base layer is made of $KNbO_3$, $KTaO_3$, $BaTiO_3$, $CaSnO_3$, $CaZrO_3$, $CdSnO_3$, $SrHfO_3$, $SrSnO_3$, $SrTiO_3$, $YScO_3$, $CaHfO_3$, $MgCeO_3$, $SrCeO_3$, $BaCeO_3$, $SrZrO_3$, $BaZrO_3$, $LiGaO_2$, mixed crystal $(Li_{1-(x+y)}Na_xK_y)(Ga_{1-z}Al_z)O_2$ of $LiGaO_2$, or a solid solution having at least two of these oxides, so as to constitute the thin film transistor in a staggered manner.

8. A thin film transistor comprising:

a semiconductor layer made of ZnO, $Mg_x Zn_{1-x} O$, $Cd_x Zn_{1-x} O$ or CdO or ZnO, $Mg_x Zn_{1-x} O$, $Cd_x Zn_{1-x} O$ or CdO that have been doped with (a) an element that can be univalent or (b) Ni; and a gate insulating film, wherein the gate insulating film includes:

a first insulating film made of a material other than an oxide for constituting an interface in combination with a gate electrode; and a second insulating film, sandwiched between the first insulating film and the semiconductor layer, that has an oxide for constituting interfaces in combination with both the first insulating film and the semiconductor layer, the second insulating film being made of $KNbO_3$, $KTaO_3$, $BaTiO_3$, $CaSO_3$, $CaZrO_3$, $CdSnO_3$, $SrHfO_3$, $SrSnO_3$, $SrTiO_3$, $YScO_3$, $CaHfO_3$, $MgCeO_3$, $SrCeO_3$, $BaCeO_3$, $SrZrO_3$, $BaZrO_3$, $LiGaO_2$, mixed crystal $(Li_{1-(x+y)}Na_xK_y)(Ga_{1-z}Al_z)O_2$ of $LiGaO_2$, or a solid solution having at least two of these oxides.

9. The thin film transistor as set forth in claim 8, further comprising a base layer having the semiconductor layer thereon, wherein the base layer is made of $KNbO_3$, $KTaO_3$, $BaTiO_3$, $CaSnO_3$, $CaZrO_3$, $CdSnO_3$, $SrHfO_3$, $SrSnO_3$, $SrTiO_3$, $YScO_3$, $CaHfO_3$, $MgCeO_3$, $SrCeO_3$, $BaCeO_3$, $SrZrO_3$, $BaZrO_3$, $LiGaO_2$, mixed crystal $(Li_{1-(x+y)}Na_xK_y)(Ga_{1-z}Al_z)O_2$ of $LiGaO_2$, or a solid solution having at least two of these oxides, so as to constitute the thin film transistor in a staggered manner.

10. The thin film transistor as set forth in claim 8, wherein the first insulating film is made of $SiN_x$.

11. The thin film transistor as set forth in claim 10, further comprising a base layer having the semiconductor layer thereon, wherein the base layer is made of $KNbO_3$, $KTaO_3$, $BaTiO_3$, $CaSnO_3$, $CaZrO_3$, $CdSnO_3$, $SrHfO_3$, $SrSnO_3$, $SrTiO_3$, $YScO_3$, $CaHfO_3$, $MgCeO_3$, $SrCeO_3$, $BaCeO_3$, $SrZrO_3$, $BaZrO_3$, $LiGaO_2$, mixed crystal $(Li_{1-(x+y)}Na_xK_y)(Ga_{1-z}Al_z)O_2$ of $LiGaO_2$, or a solid solution having at least two of these oxides, so as to constitute the thin film transistor in a staggered manner.

12. A matrix display device comprising switching elements disposed in a matrix manner, wherein each of the switching elements is constituted of a thin film transistor that includes: a semiconductor layer made of ZnO, $Mg_x Zn_{1-x} O$, $Cd_x Zn_{1-x} O$ or CdO or ZnO, $Mg_x Zn_{1-x} O$, $Cd_x Zn_{1-x} O$ or CdO that have been doped with (a) an element that can be univalent or (b) Ni; and a gate insulating film, wherein the gate insulating film has: a first insulating film made of a material other than an oxide for constituting an interface in combination with a gate electrode; and a second insulating film, sandwiched between the first insulating film and the semiconductor layer, that is made of an oxide for constituting interfaces in combination with both the first insulating film and the semiconductor layer.

13. The matrix display device as set forth in claim 12, further comprising a driving circuit for driving the switching element, wherein the thin film transistor is also used as a transistor that constitutes the driving circuit, and the switching element and the transistor are simultaneously provided.

14. The matrix display device as set forth in claim 12, wherein the thin film transistor further includes a base layer having the semiconductor layer thereon, wherein the base layer is made of $KNbO_3$, $KTaO_3$, $BaTiO_3$, $CaSnO_3$, $CaZrO_3$, $CdSnO_3$, $SrHfO_3$, $SrSnO_3$, $SrTiO_3$, $YScO_3$, $CaHfO_3$, $MgCeO_3$, $SrCeO_3$, $BaCeO_3$, $SrZrO_3$, $BaZrO_3$, $LiGaO_2$, mixed crystal $(Li_{1-(x+y)}Na_xK_y)(Ga_{1-z}Al_z)O_2$, or a solid solution having at least two of these oxides, so as to constitute the thin film transistor in a staggered manner.

15. The matrix display device as set forth in claim 12, wherein the first insulating film of the thin film transistor is made of $SiN_x$.

16. The matrix display device as set forth in claim 15, wherein the thin film transistor further includes a base layer having the semiconductor layer thereon, wherein the base layer is made of $KNbO_3$, $KTaO_3$, $BaTiO_3$, $CaSnO_3$, $CaZrO_3$, $CdSnO_3$, $SrHfO_3$, $SrSnO_3$, $SrTiO_3$, $YScO_3$, $CaHfO_3$, $MgCeO_3$, $SrCeO_3$, $BaCeO_3$, $SrZrO_3$, $BaZrO_3$, $LiGaO_2$, mixed crystal $(Li_{1-(x+y)}Na_xK_y)(Ga_{1-z}Al_z)O_2$, or a solid solution having at least two of these oxides, so as to constitute the thin film transistor in a staggered manner.

17. The matrix display device as set forth in claim 12, wherein the second insulating film of the thin film transistor is made of $SiO_2$, $Ta_2O_5$, $Al_2O_3$, $TiO_2$, MgO, $ZrO_2$, stab-$ZrO_2$, $CeO_2$, $K_2O$, $Li_2O$, $Na_2O$, $Rb_2O$, $In_2O_3$, $La_2O_3$, $Sc_2O_3$, $Y_2O_3$, or a solid solution having at least two of these oxides.

18. The matrix display device as set forth in claim 17, wherein the first insulating film of the thin film transistor is made of $SiN_x$.

19. The matrix display device as set forth in claim 18, wherein the thin film transistor further includes a base layer having the semiconductor layer thereon, wherein the base layer is made of $KNbO_3$, $KTaO_3$, $BaTiO_3$, $CaSnO_3$, $CaZrO_3$, $CdSnO_3$, $SrHfO_3$, $SrSnO_3$, $SrTiO_3$, $YScO_3$, $CaHfO_3$, $MgCeO_3$, $SrCeO_3$, $BaCeO_3$, $SrZrO_3$, $BaZrO_3$, $LiGaO_2$, mixed crystal $(Li_{1-(x+y)}Na_xK_y)(Ga_{1-z}Al_z)O_2$, or a solid solution having at least two of these oxides, so as to constitute the thin film transistor in a staggered manner.

20. A matrix display device comprising switching elements disposed in a matrix manner, wherein each of the switching elements is constituted of a thin film transistor that includes: a semiconductor layer made of ZnO, $Mg_x Zn_{1-x}$ O, $Cd_x Zn_{1-x}$ O or CdO or ZnO, $Mg_x Zn_{1-x}$ O, $Cd_x Zn_{1-x}$ O or CdO that have been doped with (a) an element that can be univalent or (b) Ni; and a gate insulating film, wherein the gate insulating film has: a first insulating film made of a material other than an oxide for constituting an interface in combination with a gate electrode; and a second insulating film, sandwiched between the first insulating film and the semiconductor layer, that constitutes interfaces in combination with both the first insulating film and the semiconductor layer, the second insulating film being made of $KNbO_3$, $KTaO_3$, $BaTiO_3$, $CaSnO_3$, $CaZrO_3$, $CdSnO_3$, $SrHfO_3$, $SrSnO_3$, $SrTiO_3$, $YScO_3$, $CaHfO_3$, $MgCeO_3$, $SrCeO_3$, $BaCeO_3$, $SrZrO_3$, $BaZrO_3$, $LiGaO_2$, mixed crystal $(Li_{1-(x+y)}Na_xK_y)(Ga_{1-z}Al_z)O_2$ of $LiGaO_2$, or a solid solution having at least two of these oxides.

21. The matrix display device as set forth in claim 20, further comprising a driving circuit for driving the switching element, wherein the thin film transistor is also used as a transistor that constitutes the driving circuit, and the switching element and the transistor are simultaneously provided.

22. The matrix display device as set forth in claim 20, wherein the thin film transistor further includes a base layer having the semiconductor layer thereon, wherein the base layer is made of $KNbO_3$, $KTaO_3$, $BaTiO_3$, $CaSnO_3$, $CaZrO_3$, $CdSnO_3$, $SrHfO_3$, $SrSnO_3$, $SrTiO_3$, $YScO_3$, $CaHfO_3$, $MgCeO_3$, $SrCeO_3$, $BaCeO_3$, $SrZrO_3$, $BaZrO_3$, $LiGaO_2$, mixed crystal $(Li_{1-(x+y)}Na_xK_y)(Ga_{1-z}Al_z)O_2$, or a solid solution having at least two of these oxides, so as to constitute the thin film transistor in a staggered manner.

23. The matrix display device as set forth in claim 20, wherein the first insulating film of the thin film transistor is made of $SiN_x$.

24. The matrix display device as set forth in claim 23, wherein the thin film transistor further includes a base layer having the semiconductor layer thereon, wherein the base layer is made of $KNbO_3$, $KTaO_3$, $BaTiO_3$, $CaSnO_3$, $CaZrO_3$, $CdSnO_3$, $SrHfO_3$, $SrSnO_3$, $SrTiO_3$, $YScO_3$, $CaHfO_3$, $MgCeO_3$, $SrCeO_3$, $BaCeO_3$, $SrZrO_3$, $BaZrO_3$, $LiGaO_2$, mixed crystal $(Li_{1-(x+y)}Na_xK_y)(Ga_{1-z}Al_z)O_2$, or a solid solution having at least two of these oxides, so as to constitute the thin film transistor in a staggered manner.

* * * * *